United States Patent [19]

Andow et al.

[11] 4,309,767
[45] Jan. 5, 1982

[54] MONITOR SYSTEM FOR A DIGITAL SIGNAL

[75] Inventors: Fumio Andow, Hachioji; Ryotaro Kondow, Fuchu; Eiichi Okamoto, Tokyo, all of Japan

[73] Assignee: Tokyo Shibaura Denki Kabushiki Kaisha, Kawasaki, Japan

[21] Appl. No.: 68,334

[22] Filed: Aug. 21, 1979

[30] Foreign Application Priority Data

Aug. 31, 1978 [JP] Japan .................................. 53-106383

[51] Int. Cl.³ ........................................... G06F 11/30
[52] U.S. Cl. ..................................... 371/24; 371/71; 340/347 M
[58] Field of Search ................. 371/24, 71; 340/347 M

[56] References Cited

U.S. PATENT DOCUMENTS

| | | | |
|---|---|---|---|
| 3,623,155 | 11/1971 | Hsiao et al. | 371/37 |
| 3,653,037 | 3/1972 | Utley | 340/347 AD |
| 3,745,561 | 7/1973 | Dijk et al. | 340/347 AD |

OTHER PUBLICATIONS

"Denki Keisan" (Electronic Calculation) vol. 43, p. 34, Jan. 1975.

Primary Examiner—David H. Malzahn
Attorney, Agent, or Firm—Oblon, Fisher, Spivak, McClelland & Maier

[57] ABSTRACT

A monitor system comprising:
an adder for summing up a plurality of unknown analog electric quantity signals denoting the operating conditions of such as a transmission line;
a multiplexer for generating output signals corresponding to the plural analog electric quantity signals and also to a signal denoting the result of addition made by said adder;
an A-D converter for converting output analog signals from the multiplexer into digital signals; and
a monitor which sums up those of the output digital signals from the A-D converter which correspond to said plural analog electric quantity signals, compares a signal denoting the result of said addition with a digital signal converted from an output signal from the adder, receives an error detection signal denoting the known prescribed electric quantity converted into a digital signal through the multiplexer and A-D converter, and judges the operating condition of the A-D converter from the contents of said received digital signal.

7 Claims, 10 Drawing Figures

MONITOR SYSTEM FOR A DIGITAL SIGNAL

This invention relates to a monitor system capable of judging whether a correct or wrong digital signal has been sent forth.

Protection of devices or members constituting an electric power system such as transmission lines, buses, transformers, etc. and control of a process device used with a power plant or substation have hitherto been carried out by drowing out current or voltage from the power plant or substation in the analog form to effect the desired protection and control.

Due to the recent development of a digital computer and digital control technique, studies are earnestly pursued to undertake the above-mentioned protection and control by the digital process. And in fact these studies are put into practice, though still on a small scale. For application of the digital control technique, analog signals are converted into digital signals by an analog-digital (A-D) converter. A highly reliable monitor system for a digital signal proposed to data for use with such digital protection-control device has a circuit arrangement shown, for example, in FIG. 1. According to this arrangement, three different analog voltage signals eA, eB, eC denoting the operating conditions of, for example, a power supply system are supplied to an adder 10 and multiplexer 11. The adder 10 calculates a sum eZ of the three analog voltage signals eA, eB, eC and delivers the calculated sum eZ to the multiplexer 11. The multiplexer 11 is so designed as to produce output signals corresponding to the received voltage signals eA, eB, eC, eZ in time sequence, for example, in the order mentioned. The output signals are supplied to the succeeding analog-digital (A-D) converter 12. Converted digital signals obtained from the A-D converter 12 constitute digital signals eA', eB', eC', eZ'. These digital signals are successively produced at points of tiime $t_0$, $t_1$, $t_2$, $t_3$. Later, converted digital signals are sent forth from the A-D converter 12 in the same order as mentioned above. The digital signals thus produced are conducted to a monitor 13 and also to a digital data processing system (not shown) for the protection and control of a power supply system. The monitor 13 is used to detect the failure of, for example, the preceding adder 10, multiplexer 11 and A-D converter 12 by the arithmetic operation of output digital signals from the A-D converter 12. Namely, the monitor 13 carries out an arithmetic operation to sum up digital signals, as eA'+eB'+eC' and further compares the sum with the digital signal eZ'. Where coincidence arises between both values, then the monitor 13 judges that the adder 10, and multiplexer 11 and A-D converter are free from errors. Where noncoincidence appears between the above-mentioned two values, then the monitor 13 determines that the adder 10 or multiplexer 11 or A-D converter 12 was erroneously operated.

The above-mentioned operation of the monitor 13 can be reliably carried out, if the A-D converter 12 is actuated under a normal condition. Where a sum of all output digital signals from the A-D converter 12 becomes zero as eA'+eB'+eC'=0 due to its failure, the monitor 13 still judges eA'+eB'+eC'=eZ' due to its inability to detect the aforesaid failure of the A-D converter 12. To avoid such difficulty, it might be considered advisable to provide four A-D converters in all, including three A-D converters for the converted digital signals eA', eB', eC' and one A-D converter for the converted digital signal eZ'. However, such arrangement involves a large number of A-D converters, too much increasing the cost of a monitor system for a digital signal as a whole for its practical application.

It is accordingly the object of this invention to provide an inexpensive monitor system for a digital signal of simple arrangement capable of producing a digital signal with high reliability.

To attain the above-mentioned object, this invention provides a monitor system for a digital signal, wherein a plurality of signals denoting unknown electric quantities are supplied to a multiplexer; the prescribed arithmetic operation of said analog signals denoting unknown electric quantities is carried out; the result of the arithmetic operation is conducted to the multiplexer; an analog error detection signal denoting the known prescribed electric quantity is also supplied to the multiplexer; output analog signals from the multiplexer are converted into digital signals; the converted digital signals are delivered to a monitor which carries out the same form of arithmetic operation as described above with respect to the converted digital signals corresponding to the analog signals denoting unknown electric quantities, compares the result of said arithmetic operation with the result of the aforesaid arithmetic operation of output digital signals from the multiplexer, and judges whether an initial known analog error detection signal still retains the prescribed contents even after digitization.

This invention can be more fully understood from the following detailed description when taken in conjunction with the accompanying drawings, in which.

Throughout the drawing, the elements the same as those of FIG. 1 are denoted by the same numerals.

Figure 1:
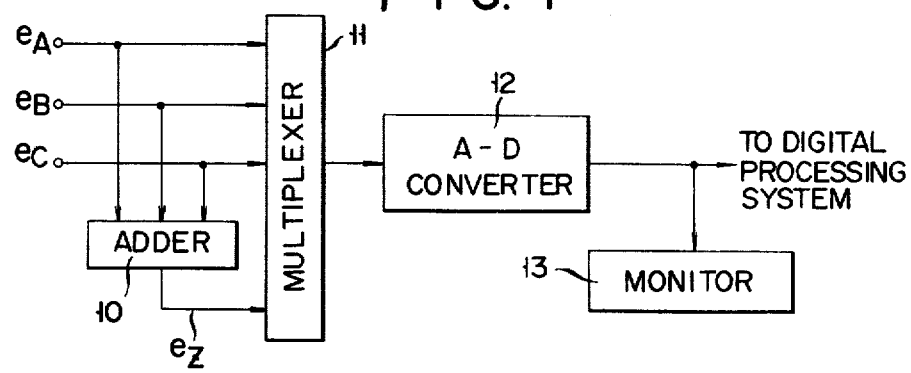
FIG. 1 is a block circuit diagram of a proposed monitor system for a digital signal to ensure highly reliable A-D conversion.
Figure 2:
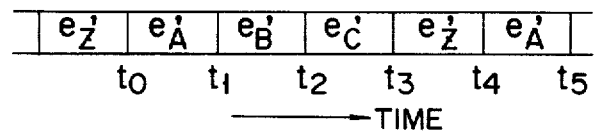
FIG. 2 is a time chart of signals, showing the operation of the monitor system of FIG. 1.
Figure 3:
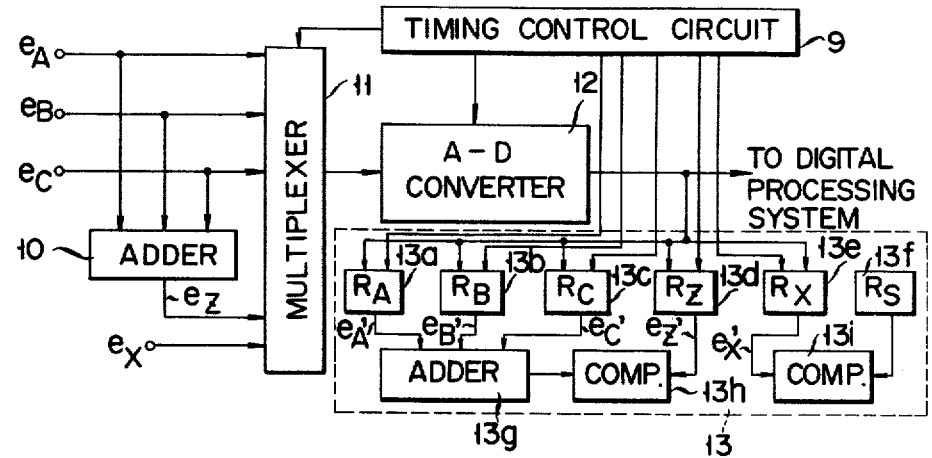
FIG. 3 is a block circuit diagram of a monitor system according to one embodiment of the invention.
Figure 4:
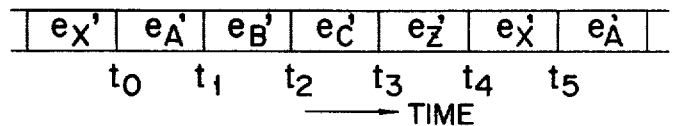
FIG. 4 is a time chart of signals, indicating the operation of the monitor system of FIG. 3.

Referring to FIG. 3, a multiplexer 11 and adder 10 an supplied with analog signals eA, eB, eC denoting the unknown electric quantities and different operating conditions of systems such as transmission lines which should be controlled and protected by a digital data-processing system (not shown). Analog electric quantity signals eA, eB, eC conducted to the adder 10 are added together. An analog sum signal eZ is supplied to the multiplexer 11, which is already supplied with an analog error detection signal eX denoting the known prescribed electric quantity. The multiplexer 11 is controlled by timing signals sent forth from a known timing control circuit 9 and generates output signals corresponding to the received analog signals eA, eB, eC, eZ, eX at substantially the same time interval in the order mentioned. Output analog signals from the multiplexer 11 are converted into digital signals by an A-D converter 12 timing-controlled by a timing signal sent forth from the timing control circuit 9, which in turn sends forth output digital signals in the time series manner indicated in FIG. 4. Digital signals eA', eB', eC', eZ', eX' of FIG. 4 have the contents corresponding to those of analog signals eA, eB, eC, eZ, eX.

Output digital signals from the A-D converter 12 are supplied to a digital data-processing system (not shown) for the protection and control of transmission lines, and also to a monitor 13. This monitor 13 carries out the arithmetic operation of received signals, thereby judging whether the respective preceding elements including the A-D converter 12 were operated under the normal condition.

As shown in FIG. 3, the monitor 13 comprises registers 13a, 13b, 13c, 13d and 13e respectively provided for storing selectively output digital signals of the A-D converter 12 under the control of timing signals delivered from the timing control circuit 9. Digital signals eA', eB' and eC' stored in the registers 13a, 13b and 13c are supplied to an adder 13g for obtaining an addition result which is in turn supplied to one input terminal of a comparator 13h. The other input terminal of the comparator 13h is supplied with a digital signal eZ' stored in the register 13d to be compared with the addition result eA'+eB'+eC'. If, in this case, any element preceding the monitor 13, particularly the multiplexer 11 does not fail, then coincidence at the comparator 13h will take place between the sum of eA'+eB'+eC' and the sum signal eZ'. If an element preceding the monitor 13 fails, then noncoincidence at the comparator 13h will be detected between said sum and the sum signal eZ'. Further, where the A-D converter 12 fails and does not produce any output signal with respect to any signal received, then the sum eA'+eB'+eC' and the sum signal eZ' become zero. In this case, too, coincidence appears, thus making it impossible to detect the failure of any element preceding the monitor 13, particularly the multiplexer 11 by the comparator 13h. With embodiment of this invention, therefore, an error detection signal eX denoting the known prescribed electric quantity is converted into a digital signal eX' by the A-D converter 12 in succession to the digital sum signal eZ' as shown in FIG. 3. The error detection digital signal eX' is supplied to the register 13e of the monitor 13. In this case, since the A-D converter 12 fails as described above, then the contents of the error detection digital signal eX' are also reduced to zero. The error detection digital signal eX' should have the known prescribed value and this digital value is stored in a register 13f previously.

The digital signal eX' obtained from the A-D converter 12 is stored in the register 13e and the digital signals or contents stored in the registers 13e and 13f are supplied to two input terminals of a comparator 13i, respectively, and compared with each other. If coincidence is obtained at the comparator 13i, it is noted that the operation of the A-D converter 12 is normal, and if noncoincidence is obtained, it is noted that the A-D converter 12 fails.

Figure 5:
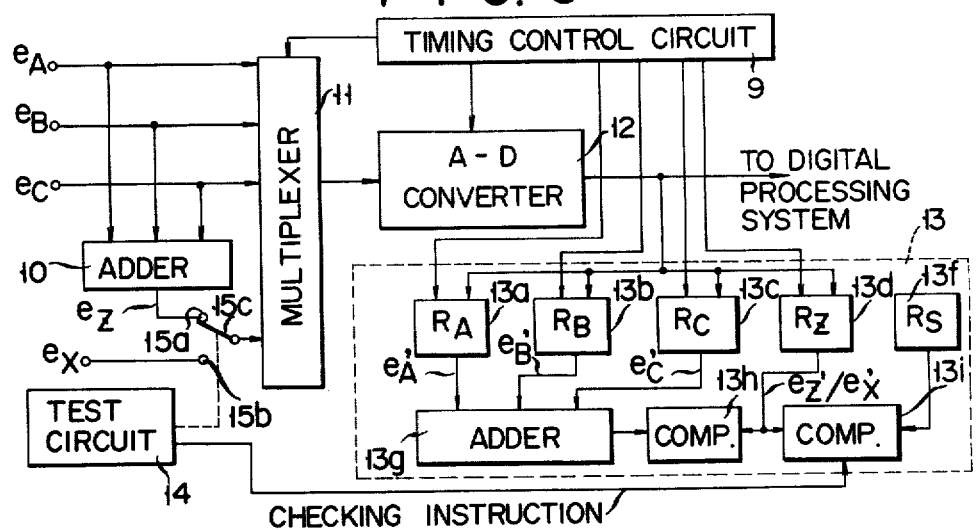
FIGS. 5, 7 and 9 are block circuit diagrams of monitor systems according to other embodiments of the invention.
Figure 6:
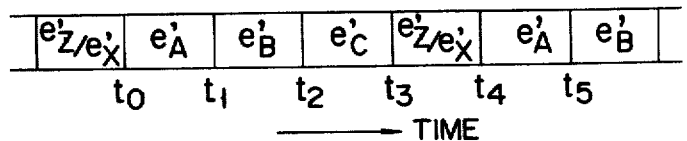
FIGS. 6 and 8 are time charts of signals, illustrating the operations of the monitor systems of FIGS. 5 and 7.
Figure 7:
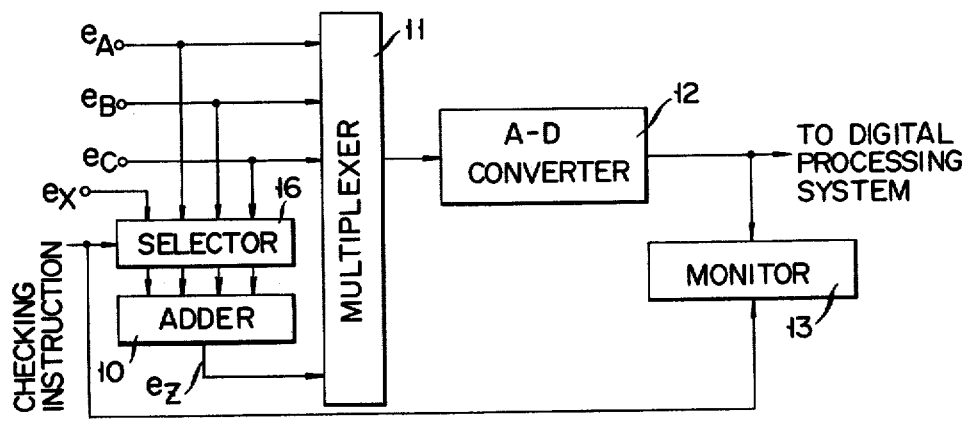
Figure 8:
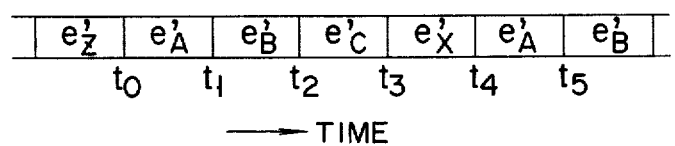

FIG. 5 is a block circuit diagram of a monitor system according to a second embodiment of this invention. Most of the arrangement of the second embodiment is the same as that of the first embodiment. Difference between the first and second embodiments consists in the three facts that in the second embodiment, a changeover switch 15 is provided to connect one of the input terminals of the multiplexer 11 to the output terminal of the adder 10 or an input terminal of the error detection signal eX, that the register 13d is used for both the signals eZ' and eX' without using the register 13e, and that a test circuit 14 is provided which, upon receipt of a checking instruction, causes the movable contact 15c of the changeover switch 15 to be shifted from the stationary contact 15a to the stationary contact 15b and sends forth a checking signal to the monitor 13. Normally, the movable contact 15c is thrown to the stationary contact 15a, thereby causing an output sum signal eZ from the adder 10 to be supplied to the multiplexer 11. Consequently the comparator 13h in the monitor 13 makes comparison between a sum of digital signals eA'+eB'+eC' and a digital sum signal eZ'. The test circuit 14 causes the movable contact 15c of the changeover switch 15 to be thrown to the stationary contact 15b and sends forth the checking instruction to the monitor 13 at the rate of once a day. As a result, the error detection signal eX is supplied to the multiplexer 11 in place of the sum signal eZ and the digital signal eX is stored in the register 13d in place of the signal eZ'. At this time, at the comparator 13i the digital signal eX' is compared with the signal stored in the register 13f to examine the contents of the error detection digital signal eX'. Thus, the comparator 13i adapted to operate only when the checking signal is issued from the test circuit 14. FIG. 6 shows that the digital sum signal eZ' and error detection digital signal eX' are interchangeably supplied to the monitor 13 during a period extending between the points of time t3 and t4, FIG. 7 is a block circuit diagram of a monitor system according to a third embodiment of this invention. With this embodiment, an input selector 16 is provided in the preceding stage of the adder 10. The operation of the selector 16 is controlled by checking instruction issued at the rate of, for example, once a day.

Normally, input electric quantity signals eA, eB, eC are supplied to the adder 10 through the selector 16. The sum signal eZ is conducted to the multiplexer 11. The monitor 13 examines whether the sum of digital signals eA'+eB'+eC' coincides with the digital sum signal eZ'. When the checking instruction is sent forth to the selector 16 and monitor 13, the selector 16 only supplies an error detection signal eX to the adder 10. At this time, the adder 10 generates the error detection signal eX in place of the sum signal eZ. The error detection signal eX is conducted from the multiplexer 11 to the A-D converter 12. The monitor 13 examines whether the error detection digital signal eX' has been issued from the A-D converter 12 in the similar manner as in the embodiment of FIG. 5. Where the checking instruction is issued at a point of time t3, then an error detection digital signal eX' is supplied to the monitor 13 during a period extending between the points of time t3 and t4.

Figure 9:
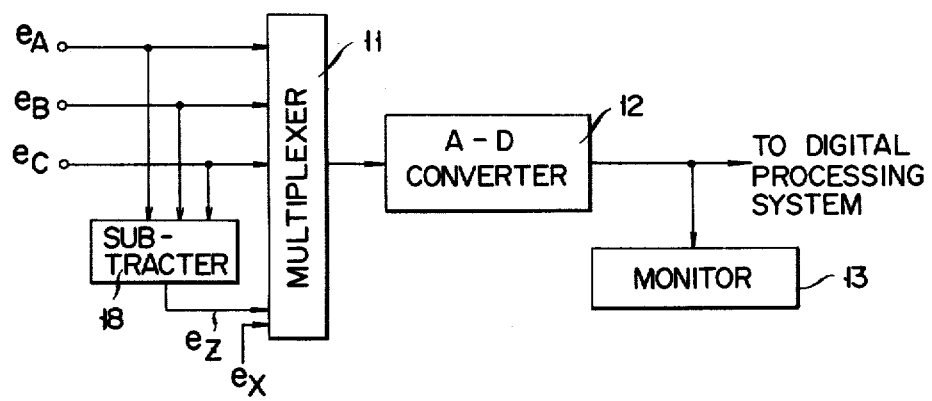

FIG. 9 is a block circuit diagram of a monitor system according to a fourth embodiment of this invention.

In FIG. 9, a subtracter 18 is provided in place of the adder 10 for calculating an equation, for example, eA−eB−eC=eZ. In this case, it should be noted that a digital subtraction circuit is provided in the digital arithmetic operation section of the monitor 13. The remaining circuit construction and the operation of the embodiment of FIG. 9 are similar to that of the embodiment of FIG. 3. Further, another arithmetic operation unit such as a weighted adder is also used other than the described adders and subtracters. This weighted adder performs an operation shown in the following equation $$eZ = K_1 eA + K_2 eB + K_3 eC \quad (K_1, K_2, K_3: \text{constant}).$$

It will be noted that this invention is not limited to the foregoing embodiments, but is applicable in various modification as described below.

(i) The error detection analog signal eX may be supplied in the form of D.C. or A.C. Where this error detection analog signal eX is supplied in the form of D.C., it is advised to examine an error detection digital signal eX' converted from said error detection analog signal eX at a certain point of time. Where the error detection signal eX is supplied in the form of A.C., it is advised to examine the digital signal eX', for example, by measuring the amplitude of the error detection signal eX supplied in the form of A.C. from a time series signal denoting the digital signal eX'.

The scope of this invention is not restricted in any way by the number of error detection signals eX used. It is possible to use a plurality of error detection signals to examine the operating condition of a monitor system as a whole by selectively applying these error detection signals in proper time sequence. Particularly the embodiment of FIG. 3 may be rearranged to supply an increased number of input terminals of the multiplexer 11 and apply a plurality of error detection signals.

Figure 10:
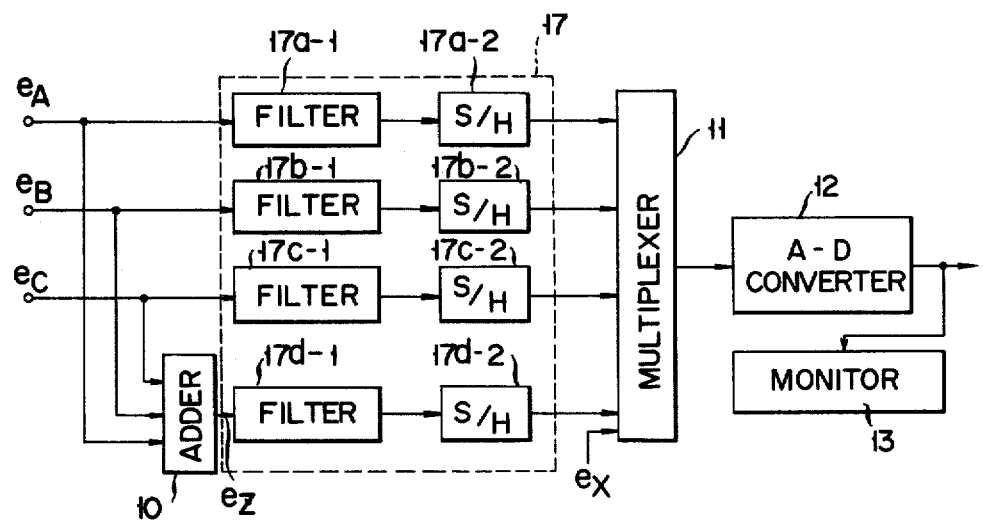
FIG. 10 is a block circuit diagram of a modification of the monitor system of FIG. 3.

(ii) It is preferred to provide, as shown in FIG. 10, a preprocessing device 17 for A-D conversion between the adder 10 and multiplexer 11 used in the embodiment of FIG. 3. This preprocessing device 17 supplies analog electric quantity signals eA, eB, eC, eZ to the multiplexer 11 through the corresponding filter 17a-1, 17b-1, 17c-1, 17d-1 and sample-hold circuits 17a-2, 17b-2, 17c-2, 17d-2. Obviously, the preprocessing device 17 arranged as described above should also have its operation examined by the monitor 13. The preprocessing device 17 may be only formed of filters or sample-hold circuits.

(iii) Throughout the embodiments, the monitor 13 was set in the monitor system itself. However, the monitor 13 may be provided in a separate device, for example, the digital data processing system. Where the monitor system is so far apart from a digital data processing system as to require the transmission of digital signals denoting the detected electric quantities monitor system to the digital data processing system, then the provision of the monitor in said processing system makes it possible to detect the errors of digital signals converted from said analog signals which might occur during the above-mentioned transmission. Generally, the digital data processing system is formed of, for example, a microcomputer or minicomputer. Therefore, the arithmetic operation in the monitor may be controlled by said digital data processing system.

Procedure after the detection by the monitor of the failure of the monitor system can obviously be taken in various forms. However, this procedure is outside of the scope of the invention, further description thereof being omitted.

What we claim is:

1. A monitor system connected to a digital data processing system, which comprises:
    an analog arithmetic operation device for arithmetically processing a plurality of unknown analog electric quantity signals;
    a multiplexer which is supplied with an output signal from said arithmetic operation device, said plural analog electric quantity signals and an error detection signal denoting a known prescribed electric quantity, and generates output signals corresponding to the plural analog electric quantity signals, the output signal from said arithmetic operation device and the error detection signal successively in a certain prescribed order;
    an analog-digital converter for converting output analog signals from the multiplexer into digital signals and for delivering the digital signals to said digital data processing system; and
    a monitor connected to receive the output of the A-D converter and including a digital arithmetic operation device for performing an arithmetic processing corresponding to that of the analog arithmetic operation device, a first comparator for comparing the output of the digital arithmetic operation device and an A-D converted output signal of said analog arithmetic operation device, a discrete register for storing a digital signal of a prescribed digital value, and a second comparator for comparing a digital error detection signal obtained through the A-D converter and the output of the discrete register.

2. The monitor system according to claim 1, which further comprises means for selectively supplying the error detection signal denoting the known prescribed electric quantity and output electric quantity signals from the analog arithmetic operation device to the multiplexer.

3. The monitor system according to claim 1, which further comprises means for selectively supplying the error detection signal denoting the known prescribed electric quantity and the plurality of unknown analog electric quantity signals to the input terminals of the analog arithmetic operation device.

4. The monitor system according to claim 1, further comprising a preprocessing device having an input connected to said unknown analog electric quantity signals and an output connected to the input of said multiplexer.

5. The monitor system according to claim 4, wherein the preprocessing device comprises at least one of a filter and a sample-hold circuit.

6. The monitor system according to claim 1 wherein:
    said discrete register stores a digital signal corresponding to said error detection signal;
    said monitor further comprises a second discrete register for storing a digital output signal from said A-D converter obtained by converting said error detection signal; and
    said second comparator compares the output of said discrete register and said second discrete register.

7. The monitor system according to claim 1, wherein said analog arithmetic operation device includes a subtracter.

* * * * *